United States Patent
Horino et al.

(10) Patent No.: US 6,169,288 B1
(45) Date of Patent: Jan. 2, 2001

(54) LASER ABLATION TYPE ION SOURCE

(75) Inventors: Yuji Horino, Ikeda; Toshiyuki Mihara, Toyonaka; Akiyoshi Chayahara; Atsushi Kinomura, both of Ikeda; Nobuteru Tsubouchi, Kawanishi, all of (JP)

(73) Assignee: Agency of Industrial Science & Technology, Ministry of International Trade & Industry, Tokyo (JP)

( * ) Notice: Under 35 U.S.C. 154(b), the term of this patent shall be extended for 0 days.

(21) Appl. No.: 09/159,510

(22) Filed: Sep. 24, 1998

(30) Foreign Application Priority Data

Oct. 3, 1997 (JP) .................................................. 9-287956

(51) Int. Cl.⁷ .................................................. H01J 37/317
(52) U.S. Cl. .................................. 250/423 P; 250/492.21
(58) Field of Search .............................. 250/423 P, 398, 250/492.21

(56) References Cited

U.S. PATENT DOCUMENTS

| 4,987,007 | * | 1/1991 | Wagal et al. | 427/53.1 |
| 5,019,705 | * | 5/1991 | Compton | 250/251 |
| 5,126,165 | * | 6/1992 | Akihama et al. | 427/53.1 |
| 5,179,279 | * | 1/1993 | Millard et al. | 250/423 P |
| 5,300,774 | * | 4/1994 | Buttrill | 250/287 |
| 5,313,067 | * | 5/1994 | Houk et al. | 250/398 |
| 5,622,567 | * | 4/1997 | Kojima et al. | 118/726 |

FOREIGN PATENT DOCUMENTS

| 60-1743 | 1/1985 | (JP) . |
| 62-186358 | 11/1987 | (JP) . |
| 63-225459 | 9/1988 | (JP) . |
| 5-279848 | 10/1993 | (JP) . |

* cited by examiner

*Primary Examiner*—Bruce C. Anderson
(74) *Attorney, Agent, or Firm*—Oblon, Spivak, McClelland, Maier & Neustadt, P.C.

(57) ABSTRACT

A laser ablation type ion source including vacuum chambers provided with a retaining section for holding a solid raw material for the generation of ions, an ion extracting electrode, an ion accelerating electrode, and a mass spectrograph for ion separation. The ion source also includes a laser beam source for injecting a laser beam of high density into the vacuum chamber.

6 Claims, 2 Drawing Sheets

LASER ABLATION TYPE ION SOURCE

BACKGROUND OF THE INVENTION

1. Field of the Invention

This invention relates to an ion source which utilizes laser ablation.

2. Description of the Prior Art

Various ion sources for use in the ion injection devices for introducing impurities into semiconductor substrates, direct ion deposition devices for depositing a thin film on a substrate, and other such devices have been studied and developed.

Among these is the ion source which utilizes so-called laser ablation (hereinafter referred to "laser ablation type ion source"). The term "laser ablation" refers to the phenomenon of a solid raw material whose surface is exposed to a pulse laser beam of high intensity separating and emitting constituent atoms and the like to generate a plume resembling a plasma near the surface of exposure. As disclosed in Japanese Public Disclosure Hei 5-279848, for example, laser ablation has been utilized for depositing a thin film on a substrate by disposing a solid raw material and the substrate opposite each other in a vacuum vessel, projecting a laser beam obliquely on the solid raw material, and allowing the atoms and the like emitted from the solid raw material to accumulate on the substrate.

The laser ablation type ion source is a device that utilizes laser ablation. The ion source takes advantage of the fact that the ratio of ions in the plasma-like plume rises in proportion as the intensity of the laser beam increases. It forms an ion beam by extracting these ions from the relevant electrode and accelerating the extracted ions. As in the technique mentioned above of using laser ablation to deposit a thin film, the conventional laser ablation type ion source is configured to project the laser beam onto the solid raw material in an oblique direction (typically 45 degrees) and to extract the ions emitted from the solid in the direction perpendicular to the surface of exposure. The laser ablation type ion source, unlike the ion source using plasma sputtering, does not require an operating gas but operates in a high vacuum. Emission of impurities is therefore effectively suppressed. The use of the laser ablation type ion source is therefore advantageous for attaining ion injection and thin film deposition with high purity.

However, the conventional laser ablation type ion source is practically deficient in ion emission efficiency relative to the intensity of the pulse laser beam. Another drawback is that the difference between the direction of laser beam projection and the direction of ion extraction requires the distance between the electrode and the solid raw material to made long so that the extracting electrode can be disposed without obstructing the laser beam. This enlarges the ion source size. Another disadvantage is the need to accommodate a space-consuming mass spectrograph for selection and separation of specific ions and for the convergence of ions. Still another is that the ion source is difficult to optically adjust.

The development of a laser ablation type ion source which is free of these problems is desired.

The inventors continued a study with a view to providing such an ion source and accomplished the present invention as a result.

SUMMARY OF THE INVENTION

This invention concerns a laser ablation type ion source which enables efficient extraction of ions from a solid raw material, is small in size, and is easy to adjust.

Specifically, this invention is directed to a laser ablation type ion source which comprises a vacuum chamber and a laser beam source for projecting a laser beam of high density into the vacuum chamber, the vacuum chamber being provided therein with a retaining section for retaining a solid raw material for generation of ions at a position exposed to the projected laser beam, a hole for allowing passage of the laser beam from the laser beam source and the ions generated from the solid raw material on the path of the laser beam projected into the vacuum chamber, an ion accelerating electrode and an ion extracting electrode disposed in this order from the laser beam source side, and a mass spectrograph for ion separating having a mass separation electromagnet for guiding specific ions passing through the hole in a direction deviating from the path of the laser beam in accordance with the mass of the ions.

DESCRIPTION OF THE PREFERRED EMBODIMENT

Figure 1:
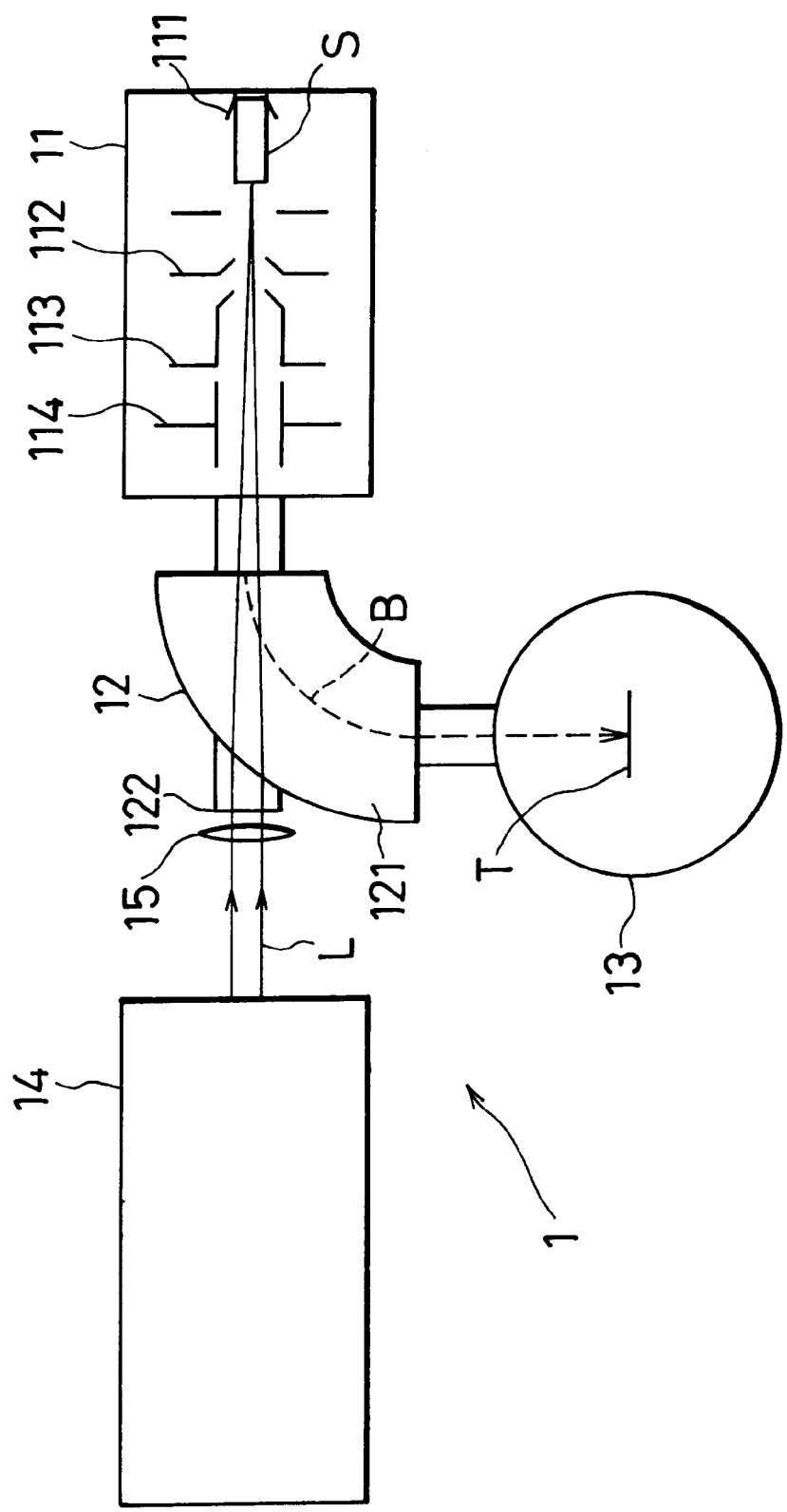
FIG. 1 is a plan view illustrating the standard structure of the laser ablation type ion source according to the present invention.

The invention will now be described with reference to the accompanying drawings. FIG. 1 is a plan view illustrating the structure of the laser ablation type ion source of the present invention.

As illustrated in FIG. 1, an ion source 1 is provided with a first chamber 11, a second chamber 12, and a third chamber 13, allowed to communicate mutually and connected to an aspiration source omitted from the illustration to construct a vacuum chamber, and a laser beam source 14. The second chamber 12 and the first chamber 11 are disposed on the path of the laser beam in order from the side of the laser beam source 14. The third chamber 13 is disposed as connected to the second chamber 12 at a position deviating from the path of the laser beam. In the first chamber 11, a retaining section 111 for holding a solid raw material S for generation of ions, an ion extracting electrode 112, an ion accelerating electrode 113, and an Einzel lenz 114 are disposed on the path of the laser beam. The retaining section 111 is disposed farthest from the laser beam source 14 and the remaining members are disposed nearer thereto in the order named. The second chamber 12 is provided with a mass spectrograph 121 for selecting and separating specific ions exclusively and a quartz window 122 for allowing passage of the laser beam. In the third chamber 13, a target T for the injection or deposition of the ions separated by the mass spectrograph 121 is retained.

As the laser beam source 14, an ArF excimer laser, a high-output pulse laser emitting a beam of a wavelength of 193 nm, or a laser beam source of a short wavelength possessing a high output and exhibiting a large energy per photon can be used advantageously. A YAG laser having the wavelength thereof shortened by means of an upconverter, for example, may be used. The high-density laser beam L emitted by the laser beam source 14 is converged by a convex lens 15 so as to be focused on the surface of the solid raw material S held by the retaining section 111, then passed through the quartz window 122 provided on the second chamber 12, and admitted into the mass spectrograph 121. Since the second chamber 12 and the first chamber 11 communicate with each other, the laser beam L passes through the interior of the mass spectrograph 121, reaches the interior of the first chamber 11, and impinges on the solid raw material S. The laser beam source 14 and the solid raw material S are preferred to be so disposed that the laser beam L impinges on the surface of the solid raw material S in a nearly perpendicular direction to the surface. Any solid substance capable of causing laser ablation can be used as the solid raw material S. Such substances include, for example, iron, carbon, silicon, molybdenum, tungsten, gold platinum, copper, niobium, tantalum, aluminum and nickel.

The laser beam L impinging on the solid raw material S ablates the raw material and forms a so-called plume near its exposed surface. The plume consists of a partially ionized vapor of the element of the raw material. The ions in this plume are pulled out toward the throughhole of the annular extracting electrode 112 disposed in front of the solid raw material S by the electric field formed thereby, accelerated by the tubular accelerating electrode 113, and then converged into an ion beam by means of the tubular Einzel lenz 114. The plume exhibits high purity because only the solid raw material S and no operating gas is present in the first chamber 11.

Figure 2:
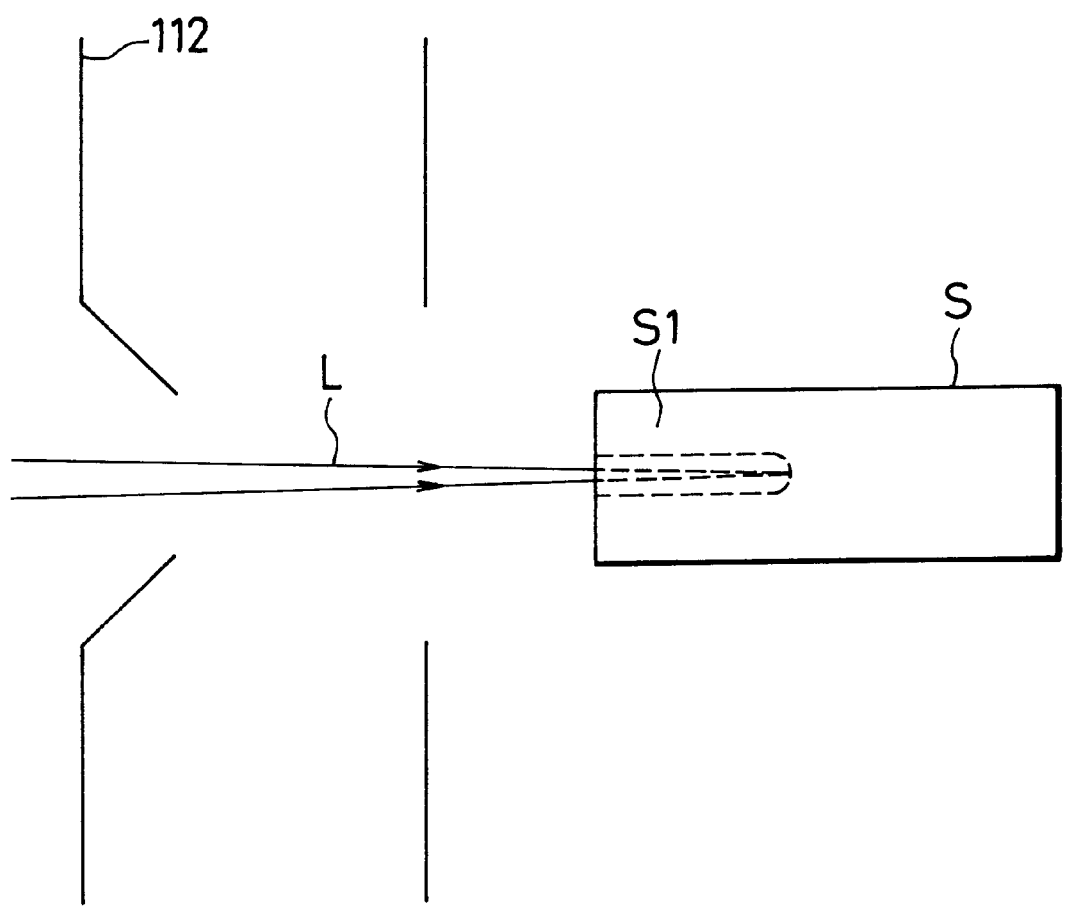
FIG. 2 is a plan view illustrating the state in which a depression is formed in a solid raw material.

The electrodes 112 and 113 and the Einzel lenz 114 are so disposed that the laser beam L may pass through the holes formed therein. Specifically, they are so disposed that the direction of projection of the laser beam L and the direction of ion extraction are nearly directly opposite to each other. As a result, the still un-ionized neutral particles contained in the plume are exposed to the laser beam L and ionized by the energy of the laser beam. Owing to this, the invention ion source has the advantage of higher ionization efficiency than the conventional laser ablation type ion source in which the neutral particles remain un-ionized. Optionally, the solid raw material S can be provided with a depression S1 extending in the direction of the projection of the laser beam, as illustrated in FIG. 2. Since the direction of the projection of the laser beam and the direction of the extraction of the ions fall nearly on the same axis, it is possible to extract ions in spite of this peculiar shape. Moreover, since the plume which occurs at the bottom of the depression S1 is released exclusively to the extracted direction of the ions, the extracting electrode 112 can extract ions with high efficiency. Further, since the direction of the projection of the laser beam L and the direction of the extracted ions fall nearly on the same axis, the ion source of this invention allows the distances from the electrodes 112 and 113 to the solid raw material S to be shortened and the size of the first chamber 11 to be decreased as compared with the conventional laser ablation type ion source. The mass spectrograph 121 and the Einzel lenz 114 and the like for converging ions do not take up much space and the optical adjustment is relatively easy. Since the laser beam is not affected by the electromagnetic field, it is in no way affected during its passage through the interiors of the electrodes 112 and 113 and the Einzel lenz 114.

The mass spectrograph 121 is disposed inside the second chamber 12 as described above. The mass separation electromagnet which is disposed inside the mass spectrograph 121 exerts an electromagnetic force on the ions passing through the Einzel lenz 114, bends the path of the ion beam B, proportionally to the mass thereof, in a prescribed direction owing to the inertia of the ion beam, and guides the ion beam to the target T inside the third chamber 13. The possibility of the ion beam B containing impurities is extremely slim because the second chamber housing the mass spectrograph 121 communicates with the first chamber 11 and is held under a high vacuum. As the possibility of the impurities entering the ion beam B is low, the probability of impurities being ionized by the energy of the laser beam L in the mass spectrograph 121 and entering the ion beam B is very low. As a result, an ion beam B of high purity can be injected into or deposited on the target T. Rather than being injected into or deposited on the target T, the ion beam B can be extracted into a desired vacuum device and used for some other purpose.

A typical experimental use of the laser ablation type ion source according to this invention for the formation of an ion beam will now described. In the apparatus illustrated in FIG. 1, an ArF excimer laser with a rated output of 20 shots per second and an output energy of 200 mJ per shot was used as the laser beam source 14 and operated to expose the surface of nickel metal as the solid raw material S. Under the conditions of the degree of vacuum of the ion source 1 set at $2 \times 10^{-8}$ Torr, voltage the accelerating electrode 113 at 17 keV, and voltage of the Einzel lenz at 13 keV, there was formed on the surface of the target T, a Ni ion beam exhibiting energy of 17 keV and current of several $\mu A$.

Since the electrodes for the extraction and acceleration of ions are each provided on the path of the laser beam with a through hole for allowing passage of the laser beam emitted from the laser light source and the ions generated by the solid raw material, this invention manifests an effect of improving the efficiency of ionization by ionizing the neutral particles in the plume which would otherwise remain un-ionized as in the conventional ion source of this type.

Further, the direction of the injection of the laser beam and the direction of the extraction of the ion beam fall nearly on the same axis in the laser ablation type ion source of the present invention. As this enables the distances between the electrodes and the solid raw material to be shortened, the ion source, particularly the vacuum chamber thereof, can be made more compact than in the conventional equivalent ion source. This invention does not need to allocate a large space for either the mass spectrograph or the device for converging ions. Further, the apparatus of this invention permits relatively easy optical adjustment and enjoys very high operational reliability.

The synthesis of a thin film of high purity by the deposition of an ion beam and high purity doping by the injection of an ion beam according to this invention can therefore be implemented efficiency and stably.

What is claimed is:

1. A laser ablation type ion source, comprising:
   a vacuum chamber and a laser beam source configured to project a laser beam of high density into said vacuum chamber,
   said vacuum chamber being provided therein with a retaining section configured to retain a solid raw material for generation of ions at a position exposed to the projected laser beam,
   a hole configured to allow passage of said laser beam from said laser beam source and the ions generated from said solid raw material on a path of said laser beam projected into said vacuum chamber,
   an ion accelerating electrode and an ion extracting electrode disposed in this order from said laser beam source side,
   said laser beam projected into said vacuum chamber having a direction opposite to but on a same axis as a direction in which the ions are extracted so as to ionize un-ionized particles of a partially ionized vapor generated by the laser beam impinging on the raw material, and a mass spectrograph for ion separation having a mass separation electromagnet configured to guide specific ions passing through said hole in a direction deviating from said path of said laser beam in accordance with the mass of said specific ions.

2. A laser ablation type ion source according to claim 1, wherein said vacuum chamber comprises a first chamber whose axial direction coincides with the direction of the laser beam from said laser beam source, a second chamber interposed between said laser light source and said first chamber and adapted to accommodate an ion beam deviating from said path of said laser beam, and a third chamber communicating with said second chamber, said first chamber is provided with a retaining section for a solid raw material for generation of ions and electrodes for extracting and accelerating ions, said second chamber is provided with a mass spectrograph for ion separation incorporating therein a mass separation electromagnet, and said third chamber is provided with a target for an ion beam.

3. A laser ablation type ion source according to claim 1, wherein a convex lens is disposed on said path of laser beam between said laser beam source and said first chamber so as to converge said laser beam on the surface of said solid raw material.

4. A laser ablation type ion source according to claim 1, which further comprises an Einzel lenz for converging ions and forming an ion beam disposed between said laser beam source and said accelerating electrode.

5. A laser ablation type ion source according to claim 1, wherein said solid raw material is at least one member selected from solid materials capable of laser ablation.

6. A laser ablation type ion source according to claim 5, wherein said solid raw material is at least one member selected from the group consisting of nickel, iron, carbon, silicon, molybdenum, tungsten, gold, platinum, copper, niobium, tantalum, and aluminum.

* * * * *